(12) United States Patent
Rachmady et al.

(10) Patent No.: US 11,482,621 B2
(45) Date of Patent: Oct. 25, 2022

(54) VERTICALLY STACKED CMOS WITH UPFRONT M0 INTERCONNECT

(71) Applicant: Intel Corporation, Santa Clara, CA (US)

(72) Inventors: Willy Rachmady, Beaverton, OR (US); Patrick Morrow, Portland, OR (US); Aaron Lilak, Beaverton, OR (US); Rishabh Mehandru, Portland, OR (US); Cheng-Ying Huang, Hillsboro, OR (US); Gilbert Dewey, Beaverton, OR (US); Kimin Jun, Portland, OR (US); Ryan Keech, Portland, OR (US); Anh Phan, Beaverton, OR (US); Ehren Mannebach, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 883 days.

(21) Appl. No.: 16/143,222

(22) Filed: Sep. 26, 2018

(65) Prior Publication Data

US 2020/0098921 A1  Mar. 26, 2020

(51) Int. Cl.
*H01L 29/78* (2006.01)
*H01L 21/768* (2006.01)
*H01L 29/66* (2006.01)
*H01L 29/06* (2006.01)

(52) U.S. Cl.
CPC .... *H01L 29/7851* (2013.01); *H01L 21/76822* (2013.01); *H01L 21/76829* (2013.01); *H01L 29/0669* (2013.01); *H01L 29/66568* (2013.01); *H01L 29/66795* (2013.01)

(58) Field of Classification Search
CPC .......... H01L 29/66439; H01L 29/0669; H01L 29/66795; H01L 29/76896; H01L 29/7851; H01L 27/0792; H01L 27/0924; H01L 21/76822; H01L 21/82371; H01L 23/535; H01L 23/5386; H01L 21/8221; H01L 27/0688

See application file for complete search history.

(56) References Cited

U.S. PATENT DOCUMENTS

2021/0384191 A1* 12/2021 Pillarisetty ............ H01L 27/088

* cited by examiner

*Primary Examiner* — Thanhha S Pham
(74) *Attorney, Agent, or Firm* — Schwabe, Williamson & Wyatt, P.C.

(57) ABSTRACT

Embodiments include transistor devices and a method of forming the transistor devices. A transistor device includes a first dielectric over a substrate, and vias on a first metal layer, where the first metal layer is on an etch stop layer that is on the first dielectric. The transistor device also includes a second dielectric over the first metal layer, vias, and etch stop layer, where the vias include sidewalls, top surfaces, and bottom surfaces, and stacked transistors on the second dielectric and the top surfaces of the vias, where the sidewalls and top surfaces of the vias are positioned within a footprint of the stacked transistors. The stacked transistors include gate electrodes and first and second transistor layers. The first metal layer includes conductive materials including tungsten or cobalt. The footprint may include a bottom surface of the first transistor layer and a bottom surface of the gate electrodes.

16 Claims, 6 Drawing Sheets

VERTICALLY STACKED CMOS WITH UPFRONT M0 INTERCONNECT

FIELD

Embodiments relate to semiconductor structures and processing. More particularly, the embodiments relate to semiconductor structures that are initially implemented with a first metal layer (M0) interconnect and then vertically stacked with complementary metal-oxide-semiconductor (CMOS) transistors.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

The drive to scale integrated circuits, such as complementary metal-oxide-semiconductor (CMOS) devices, has been obtained through the use of vertically stacked CMOS transistors. The formation of such vertically stacked CMOS transistors typically require integrating metal layer interconnects from the backside of the CMOS transistors. That is, CMOS devices are generally fabricated by stacking one layer of transistors over another layer of transistors—and so on—to form vertically stacked CMOS transistors. The formation of such transistors thus requires materials with different etch selectivity which are not cost-efficient.

Furthermore, after the vertically stacked CMOS transistors are formed, the backside of the transistors are then integrated with interconnects using a substantially complex process. This process requires complex backside contact lithographic patterning, thereby considerably increasing lithographic patterning alignment issues. In particular, the process needs to implement wafer bonding, wafer flipping, multi-color patterning schemes, complex interconnect schemes, and very tight lithographic edge placement error (EPE) budgets.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
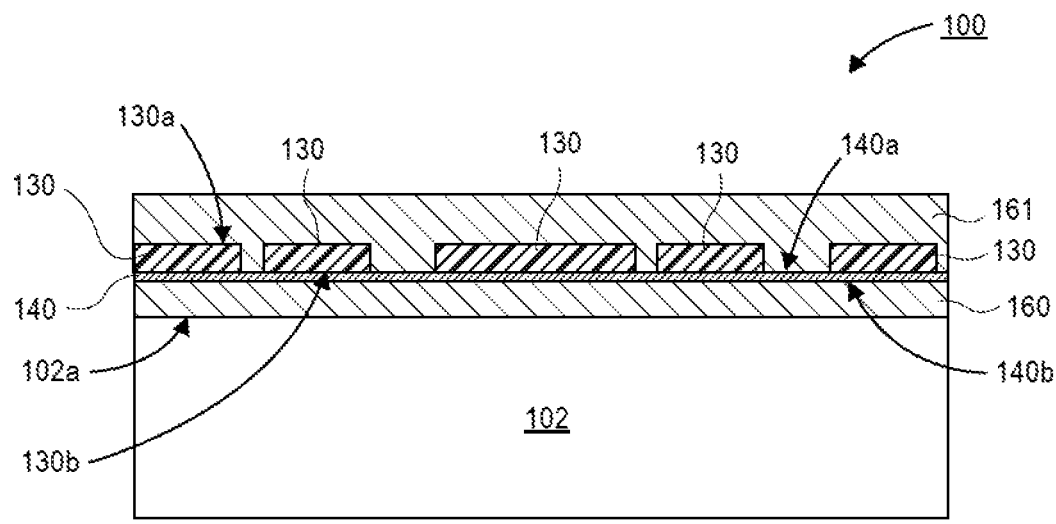
FIG. 1A is an illustration of a cross-sectional view of a substrate having a metal layer disposed between a plurality of interlayer dielectrics (ILD) layers, according to one embodiment.

Embodiments described herein include semiconductor structures, such as vertically stacked complementary metal-oxide-semiconductor (CMOS) transistors, coupled upfront with one or more metal layer interconnects. Additionally, the embodiments described herein include a substrate having a plurality of stacked transistors (e.g., fin field effect transistors (FinFET) transistors, nanowire/nanoribbon (NW/NR) transistors, etc.) disposed over a plurality of interlayer dielectric (ILD) layers and a plurality of metal layers (e.g., a first metal layer (M0), a second metal layer (M1), and so on).

In these embodiments, the substrate may be implemented by initially forming the metal layers with a plurality of vias, then transferring/disposing a plurality of epitaxial (EPI) layer stacks on the exposed vias and the metal layers, and subsequently patterning the EPI layer stacks to form the stacked transistors. The embodiments described herein improve CMOS scaling solutions by enabling, for example, static random-access memory (SRAM) devices to be scaled for future technologies via three-dimensional (3D) monolithic stacking of CMOS transistors. Some other advantages of these embodiments include: (i) eliminating the complex backside contact patterning (e.g., the multi-color patterning scheme, complex interconnect schemes, etc.) are required to form vertically, self-aligned stacked CMOS transistors; (ii) substantially reducing the heightened lithographic (litho) alignment risk associated with wafer flipping and grinding, such as mitigating the tight litho edge placement error (EPE) issues; and (iii) improving the litho alignment of the metal layers and the vias with the stacked transistors. One major advantage of the embodiments described herein includes enabling the substrates to be integrated with various CMOS technologies (or the like), including NW/NR architectures, FinFET architectures, and any other metal-oxide-semiconductor (MOS) architectures.

In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as integrated circuit design layouts such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

As used herein, the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Likewise, certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to structures and architectures for fabricating (or forming) CMOS devices which integrate a first (or a bottommost) metal layer (or a first metal layer interconnect) of a substrate with a self-aligned stacked CMOS structure. As used herein, the terms metal line, interconnect line, trace, wire, conductor, signal path, and signaling medium are all related and often used interchangeably. Furthermore, as used herein, a "metal layer" (e.g., a first metal layer (M0, and so on)) refers to a conductive layer that may include traces, wires, lines, interconnects, and/or any metal/conductive formations. In particular, as used herein, a "first metal layer" (also referred to as a first metal interconnect and/or a M0 interconnect) refers to a conductive layer or a conductive interconnect in a build-up structure (e.g., a wafer (or a substrate) with a plurality of stacked ILD layers) in which such conductive layer/interconnect is disposed (or formed) as the bottommost conductive layer/interconnect in the build-up structure. That is, in the embodiments described herein, a first metal layer may be disposed parallel to a topmost surface of a wafer based on the z-axis, as such the first metal layer from a plurality metal layers is located nearest in proximity to the topmost surface of the wafer based on the z-axis.

For example, the metal layer may include one or more materials, including one or more high temperature metal materials such as tungsten (W), cobalt (Co), any combination thereof, and/or the like. In other examples, the metal layer may be any suitable metal such as aluminum (Al), copper (Cu), and/or an alloy of Al and Cu, that are used as conductors to provide signal paths for coupling or interconnecting, electrical circuitry. In addition, the metal layer may include a metal trace (or a metal line/plane/pad) and a via that is coupled to the metal trace, where the via (or contact) may refer to a conductive interconnect/structure used to electrical couple/connect conductors, such as metal traces, from different metal/interconnect levels.

These CMOS devices described herein may be implemented in one or more components associated with an integrated circuit (IC) and/or between various such components. As described herein, the terms chip, integrated circuit (IC), monolithic device, semiconductor device, semiconductor package, and microelectronic device, are often used interchangeably in the semiconductor packaging field, and thus the embodiments described herein may be applicable to all of the above as known in this field. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in, for example, a computer.

Additionally, the embodiments described herein may be implemented further in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including an electronic device implementing one or more self-aligned substrates having metal layers coupled upfront to vertically stacked transistors (e.g., as shown below in FIGS. 1A-1E).

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

FIGS. 1A-1E are illustrations of cross-sectional views of a process flow of forming a substrate 100 having a metal layer 130 (or a metal layer interconnect) coupled upfront to a plurality of stacked transistors 170 (or a plurality of stacked transistor layers), according to some embodiments. In particular, these embodiments as shown with respect to FIGS. 1A-1E may provide a process flow for scaling CMOS devices (e.g., SRAM and the like) via a 3D monolithic stacking of CMOS transistors by implementing the substrate 100 to initially form the metal layer 130 (or metal layers (M0, M1, M2, M3, and so on)) with a plurality of vias 110, and then couple/integrate the metal layer 130 and vias 110 upfront (i.e., without requiring wafer bonding, flipping, and grinding processes) with the stacked transistors 170.

According to some embodiments, the process flow may at first start with the fabrication of one or more interlayer dielectric (ILD) layers, etch stop layers, metal layers, and interconnects (e.g., the ILD layers 160-161, the etch stop layer 140, the first metal layer 130, and the vias 110) on a silicon (Si) wafer (e.g., the substrate 100). In some embodiments, the process flow may subsequently dispose (or transfer) one or more EPI layer stacks (e.g., an EPI layer stack having a first layer of Si, a second layer of silicon germanium (SiGe), and a third layer of Si (Si/SiGe/Si)) onto the metal layers/interconnects of the Si wafer.

Lastly, according to some embodiments, the process flow may pattern the EPI layer stacks to form vertically self-aligned stacked transistors (e.g., a first transistor layer 165, a second transistor layer 175, and so on), where the stacked transistors include a bottommost stacked transistor layer (e.g., the first transistor layer 165) having one or more portions/surfaces (e.g., as illustrated with labels 180 in FIG. 1E, which illustrates the one or more portions/surfaces with a bottom surface 165a of the first transistor layer 165, and a bottom surface 170a of a gate electrode 170) directly disposed on one or more surfaces (e.g., the top surfaces 110a of the vias 110) of one or more metal interconnects (e.g., the vias 110)—without the metal interconnects having an offset (e.g., also illustrated with labels 180 of FIG. 1E) between the portions/surfaces of the bottommost transistor layer and the surfaces of the metal interconnects.

That is, in some embodiments, the top surfaces of the metal interconnects may be formed and directly coupled upfront with the surfaces of the bottommost stacked transistor layer, as such, for example, the totality of the top surfaces are positioned directly below the portions/surfaces of the bottommost stacked transistor layer. For example, the process flow described herein may implement that no portion of any of the top surfaces of the metal interconnects (e.g., the sidewalls and the top surfaces of the vias) may be positioned/located outside a footprint of the bottommost stacked transistors. In other words, the process flow may dispose a plurality of stacked transistors on a top surface of one of the ILD layers and the top surfaces of the metal interconnects (or the vias), where the sidewalls and the top surfaces of the metal interconnects are positioned within a footprint of the stacked transistors As used herein, a "footprint" may refer to a surface space (or an amount of surface space) occupied by a structure or a component, such as a transistor device. For example, the transistor device may have a bottommost transistor layer (e.g., the first transistor layer 165 of FIG. 1E), including the combined bottom surfaces of the channels and the gate electrodes of the bottommost transistor layer, which may have a footprint that is positioned directly above the interconnects/vias coupling the bottommost transistor layer to the first metal layer (M0). In addition, as used herein, an "offset" may be used in reference to a first structure (e.g., the vias 110 of FIG. 1E) having a displacement of surface space/area between a footprint of the first structure and a footprint of a second structure (e.g., the bottom surface 170a of the stacked transistors 170 of FIG. 1E). As such, some of the embodiments described herein enable a technique for scaling substrates (e.g., transistor devices, SRAM, etc.) for CMOS processing technologies by disposing a metal interconnect upfront with stacked transistors (or vertically self-aligned stacked transistors) as the edges of the metal interconnects are directly positioned vertically below the first transistor layer of the vertically self-aligned stacked transistors—without requiring multi-color patterning schemes and EPE issues.

The process flow may accomplish the transferring and coupling of the vertically stacked transistors to the metal layers/interconnects using, for example, a bonding and cleaving technique. Note that, as shown in FIGS. 1A-1E, the process flow may be implemented using one or more transistors such as, but not limited to, N-channel MOS (NMOS) transistors, P-channel MOS (PMOS), nanoribbon transistors, nanowire transistors, and/or the like.

Referring now to FIG. 1A. In one embodiment, the substrate 100 having the first metal layer 130, the ILD layers 160-161, the etch stop layer 140, and a wafer 102 (or a base wafer). For some embodiments, the first metal layer 130 may be disposed between the first ILD layer 160 and the second ILD layer 161. In one embodiment, the first metal layer 130 may include a top surface 130*a* that is opposite to a bottom surface 130*b*. In one embodiment, the bottom surface 130*b* of the first metal layer 130 may be disposed on a top surface 140*a* of the etch stop layer 140, while the first ILD layer 160 is disposed between the bottom surface 140*b* of the etch stop layer 140 and a top surface 102*a* of the wafer 102.

For one embodiment, the wafer 102 may be a base wafer (or the like). The wafer 102 may be singulated (or diced)—at the wafer level—into a plurality of dies (or wafer dies). For example, the wafer 102 may be any suitable type of wafer such as a crystalline substrate, a bulk silicon wafer, a silicon-on-insulator (SOI) wafer, an engineered substrate formed of one or more semiconductor materials (e.g., crystalline silicon, amorphous silicon, polysilicon, etc.), and/or the like. In addition, for some embodiments, the wafer 102 may be full or ground down to a predetermined substrate thickness.

In other embodiments, the wafer 102 may be any suitable type of substrate formed using alternate materials, which may or may not be combined with silicon, that include but are not limited to germanium, indium antimonide, lead telluride, indium arsenide, indium phosphide, gallium arsenide, indium gallium arsenide, gallium antimonide, and/or other combinations of group III-V, group II-VI, or group IV materials. Although a few examples of materials from which the wafer (or the substrate) may be formed are described here, any material that may serve as a foundation (or a foundation layer) upon which a CMOS device may be dispose on may be included (or considered) a wafer.

In one embodiment, the substrate 100 may include the first metal layer 130 as the bottommost metal layer. As described herein, a "bottommost metal layer" refers to a metal layer (or a metal interconnect layer) that is closest in proximity (based on the z-axis) to a topmost surface of a wafer. Accordingly, in some embodiments, the first metal layer 130 (M0) as the bottommost metal layer of the substrate 100 is the closest in proximity to the top surface 102*a* of the wafer 102. That is, the first metal layer 130 (M0) has the smallest z-height distance (or thickness/depth) between the bottom surface 130*b* of the first metal layer 130 (M0) and the top surface 102*a* of the wafer 102 compared to any other z-height distance(s) between any other bottom surface(s) of any additional metal layer(s) (M1 and so on) and the top surface 102*a* of the wafer 102. For other embodiments, the substrate 100 may include one or more metal layers that may be similar to the first metal layer 130. In some embodiments, the one or more metal layers (e.g., a second metal layer (M1), a third metal layer (M2), and so on (i.e., M3-M(n), where "n" is any desired number of total additional metal layers that are stacked above the M0 layer) may be stacked over the first metal layer 130 (M0) to form a plurality of stacked metal layers by implementing additional ILD layers and etch stop layers.

According to some embodiments, the first metal layer 130 may be formed of one or more conductive materials, where the conductive materials may include one or more heat resistance properties (e.g., high temperature metals that are resistive to high temperatures). In one embodiment, the first metal layer 130 may be one or more high temperature metals, such as tungsten (W), cobalt (Co), and the like, which can accommodate FE processing temperatures. In an alternate embodiment, the first metal layer 130 may include copper (Cu) combined with the one or more high temperature metals (if needed) based on the desired packaging design.

In some embodiments, the first metal layer 130 may be a conductive layer comprising of conductive lines/traces, metallic pads, vias, via pads, planes, and/or holes. The first metal layer 130 may be formed using any lithographic patterning and plating process or the like. In alternate embodiments, the first metal layer 130 may include one or more electrically conductive materials such as any suitable electrically conductive material, alloy, or a stack of multiple electrically conductive materials, which are substantially resistive to high temperatures or accommodating to the FE processing temperatures (or similar heating processes). In some embodiments, various electrically conductive materials described herein may also include one or more metals or metal alloys, with metals such as, for example, ruthenium, palladium, platinum, cobalt, nickel, hafnium, zirconium, titanium, tantalum, and/or aluminum. In some embodiments, various electrically conductive materials described herein may include one or more electrically conductive alloys oxides or carbides of one or more metals. For some embodiments, the first metal layer 130 may be formed using any suitable known deposition and patterning techniques, such as, for example, atomic layer deposition (ALD), chemical vapor deposition (CVD), physical vapor deposition (PVD), and any other various lithographic techniques (e.g., photolithography or electron-beam lithography).

For some embodiments, the ILD layers 160-161 may be formed using dielectric materials having low-k dielectric materials. As used herein, a "low-k dielectric" refers to a material having a lower dielectric constant (k) than silicon oxide, where the terms "oxide," "carbide," "nitride," etc. refer to compounds containing, respectively, oxygen, carbon, nitrogen, etc. Examples of such dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and/or organosilicates, such as silsesquioxane, siloxane, or organosilicate glass. For some embodiments, the ILD layers 160-162 may include pores or air gaps to further reduce their dielectric constant.

In other embodiments, the ILD layers 160-161 may include one or more dielectric materials having a high-k dielectric, such as elements include hafnium, silicon, oxygen, titanium, tantalum, lanthanum, aluminum, zirconium, barium, strontium, yttrium, lead, scandium, niobium, and/or zinc. As used herein, a "high-k dielectric" refers to a material having a higher dielectric constant (k) than silicon oxide, where the terms "oxide," "carbide," "nitride," etc. refer to compounds containing, respectively, oxygen, carbon, nitrogen, etc. Examples of high-k materials that may be used in the ILD layers 160-161 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and/or lead zinc niobate.

In some embodiments, the etch stop layer 140 may include an etch resistant material, such as, but not limited to TiO, ZrO, AlN, ZrAlTiO, AlO, and/or the like. For additional embodiments, although FIG. 1A illustrates the etch stop layer 140 as a single etch layer for simplicity, the substrate 100 may include a plurality of etch layers that may be similar to the etch stop layer 140. As such, in alternate embodiments, the substrate 100 may include the etch stop layer 140 and one or more additional etch layers stacked above the etch stop layer 140. In these embodiments, the plurality of etch layers (including the etch stop layer 140) may be formed of a monolithic etch selectivity material and thus do not require a different etch selectively material.

Note that the substrate 100 as shown in FIG. 1A may include fewer or additional packaging components and/or materials based on the desired packaging design.

Figure 1B:
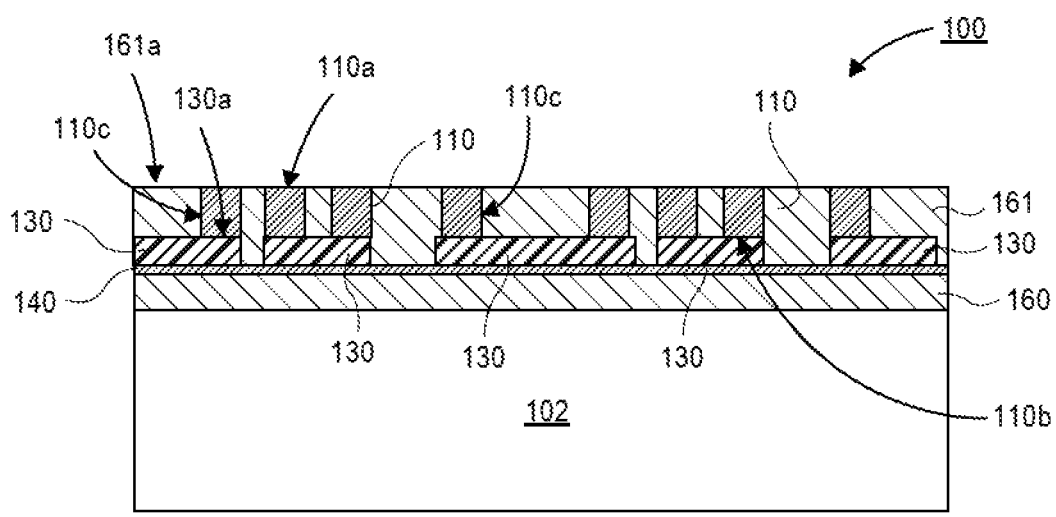
FIG. 1B is an illustration of a cross-sectional view of a substrate having a plurality of vias coupled to a metal layer disposed between a plurality ILD layers, according to one embodiment.

FIG. 1B is an illustration of a cross-sectional view of a substrate 100 having a plurality of vias 110 coupled to a first metal layer 130 disposed between a plurality ILD layers 160-161, where the vias 110 have top surfaces 110a that may be exposed, according to one embodiment. The substrate 100 illustrates disposing the vias 110 over the ILD layers 160-161, the first metal layer 130, the etch stop layer 140, and the wafer 102.

For some embodiments, the bottom surfaces 110b of the vias 110 may be disposed on the top surfaces 130a of the first metal layer 130. In some embodiments, the substrate 100 may implement a conventional lithographic patterning and plating process to form the vias 110 through the second ILD layer 161 and dispose on/over the top surfaces 130a of the first metal layer 130. In one embodiment, the vias 110 may be patterned and formed to have one or more sidewalls 110c, where the sidewalls may be vertical (i.e., vertical sidewalls). In another embodiment, the vias 110 may be patterned and formed to have one or more sidewalls 110c, where the sidewalls may be tapered (i.e., tapered sidewalls). As such, in some embodiments, the vias 110 may have vertical sidewalls or tapered sidewalls. Furthermore, after forming/plating the vias 110, the top surface 161a of the second ILD layer 161 and/or the vias 110 may be etched to expose the top surfaces 110a of the vias 110, according to some embodiments. The exposed top surfaces 110a of the vias 110 may be formed with an etching/grinding process such as dry etching, wet etching, any combination thereof, and/or the like.

In some embodiments, the exposed top surfaces 110a of the vias 110 may be used for coupling another metal layer (e.g., a second metal layer (M1)) to the first metal layer 130. Meanwhile, in other embodiments, the exposed top surfaces 110a of the vias 110 are used for coupling upfront a plurality of stacked transistors (e.g., the plurality of stacked transistors 170 of FIG. 1E) to the first metal layer 130, where the stacked transistors are subsequently formed from one or more EPI layer stacks (e.g., a first EPI layer stack 108 of FIG. 1C) that are disposed on the ILD layers 160-161.

Note that the substrate 100 as shown in FIG. 1B may include fewer or additional packaging components and/or materials based on the desired packaging design.

Figure 1C:
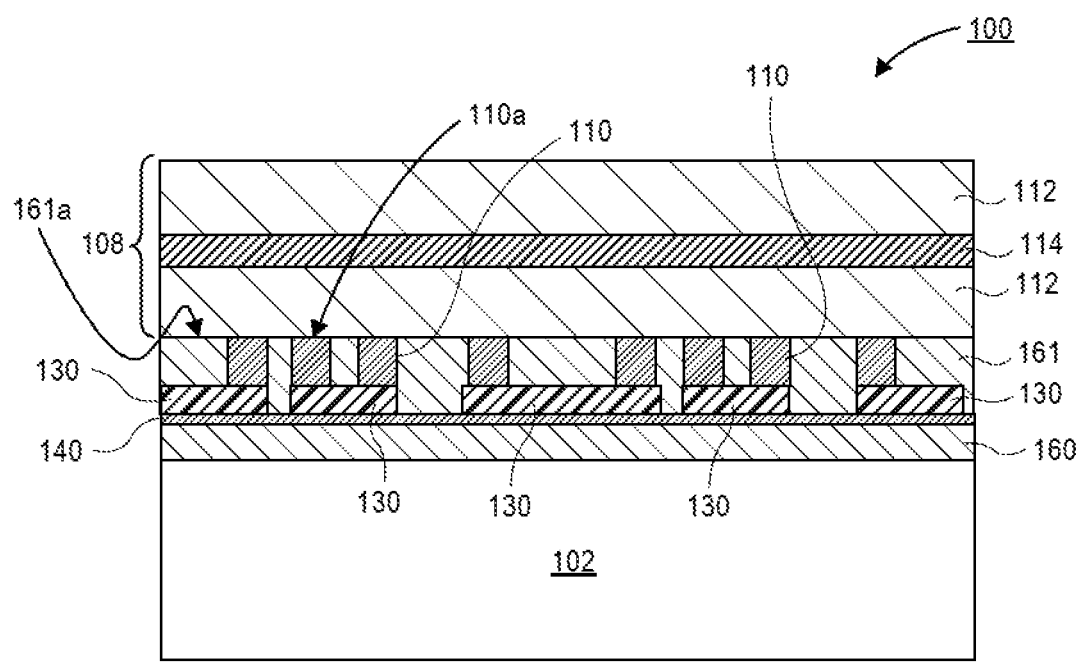
FIG. 1C is an illustration of a cross-sectional view of a substrate having an epitaxial (EPI) layer stack disposed over a plurality of ILD layers and a metal layer, according to one embodiment.

FIG. 1C is an illustration of a cross-sectional view of a substrate 100 having a first EPI layer stack 108 disposed over a plurality of ILD layers 160-161 and a first metal layer 130, according to one embodiment. The substrate 100 illustrates disposing (or transferring) the first EPI layer stack 108 over the vias 110, the ILD layers 160-161, the first metal layer 130, the etch stop layer 140, and the wafer 102, where disposing/transferring the first EPI layer stack 108 over the wafer 102 may be enabled with a conventional bonding and cleaving process (or any other similar process/technique).

In some embodiments, the first EPI layer stack 108 may be disposed on the top surface 161a of the second ILD layer 161 and the top surfaces 110a of the vias 110 that are coupled to the first metal layer 130. In one embodiment, the first EPI layer stack 108 may include a second layer 114 disposed (or sandwiched/encapsulated) between first and third layers 112, where the first and third layers 112 may be formed of Si, and the second layer 114 may be formed of SiGe. For one embodiment, the second layer 114 of the first EPI layer stack 108 may be used as a sacrificial layer to subsequently form one or more transistors (e.g., as shown below in FIG. 1E). In alternate embodiments, the first EPI layer stack 108 may include any number of layers (i.e., greater or less than three layers) based on the desired processing/packaging design (e.g., a FinFET architecture, a NW/NR architecture, etc.).

Additionally, for some embodiments, the first EPI layer stack 108 may be implemented such that each of the first, second, and third layers 112 and 114 is formed of different materials. In other embodiments, the first EPI layer stack 108 may be formed of any suitable CMOS materials that may be used to form one or more CMOS devices (e.g., transistors, memory, etc.). For one embodiment, the first and third layers 112 may have a thickness that is greater than a thickness of the second layer 114. In another embodiment, the first and third layers 112 may have a thickness that is approximately equal to a thickness of the second layer 114. Note that, as shown below in FIG. 1D, the first EPI layer stack 108 may include one or more second layers 114 (or the sacrificial layers) which may be formed of SiGe.

Note that the substrate 100 as shown in FIG. 1C may include fewer or additional packaging components and/or materials based on the desired packaging design.

Figure 1D:
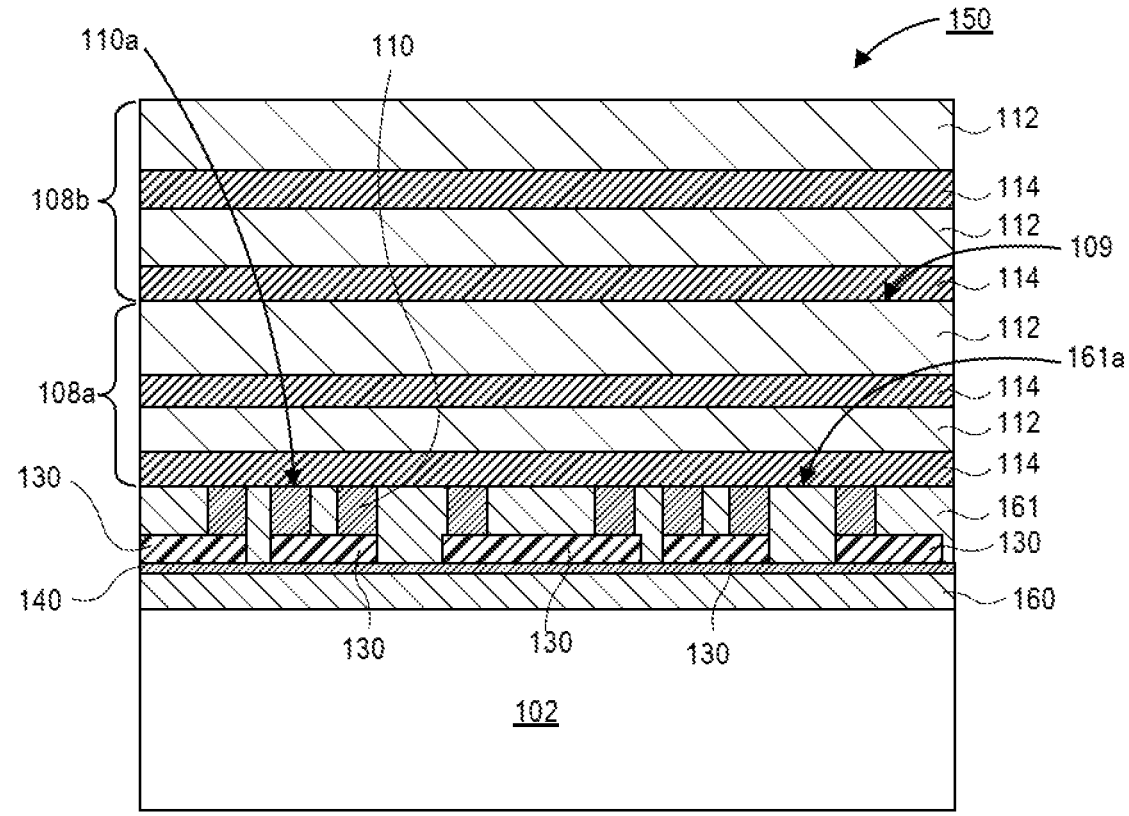
FIG. 1D is an illustration of a cross-sectional view a substrate having a plurality of EPI layer stacks disposed over a plurality of ILD layers and a metal layer, according to an optional embodiment.
Figure 1E:
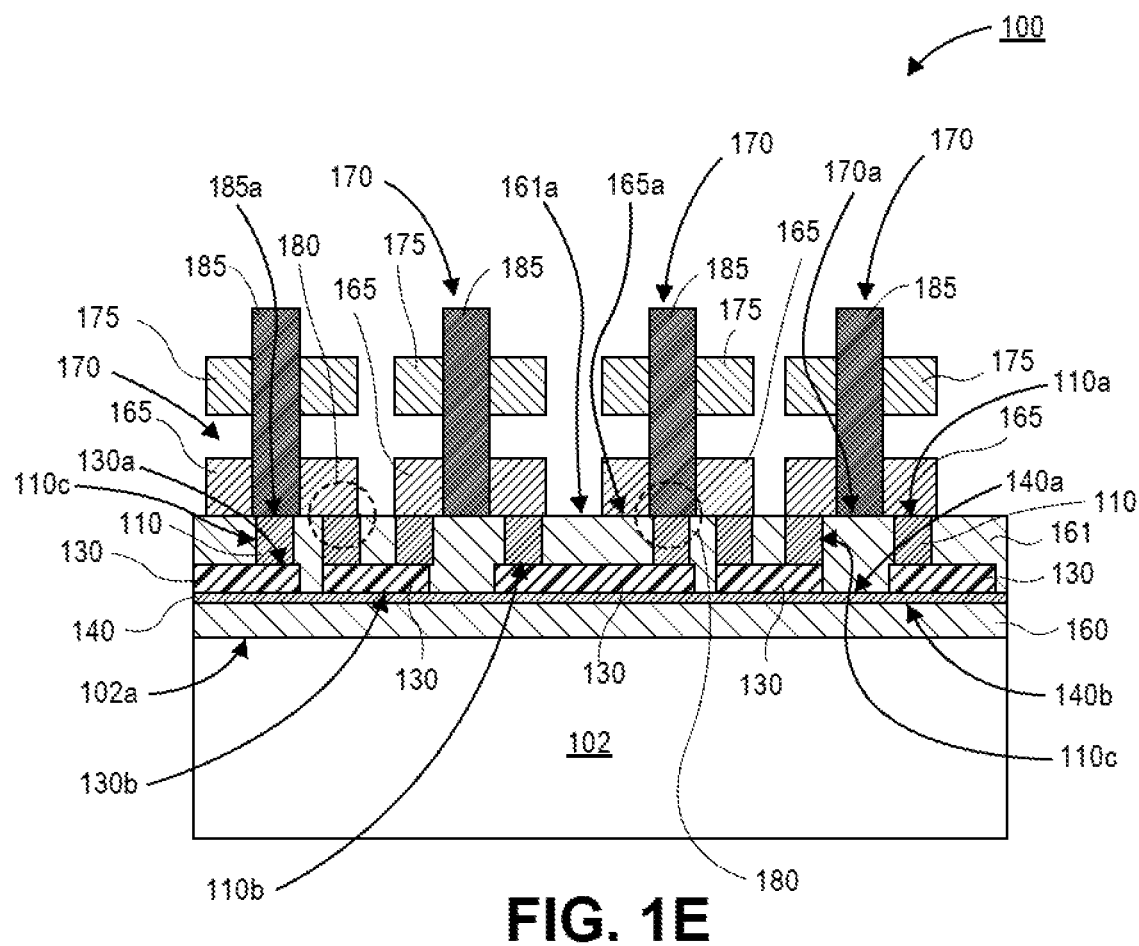
FIG. 1E is an illustration of a cross-sectional a substrate having a plurality of stacked transistors disposed over a plurality of ILD layers and a metal layer, where the stacked transistors are coupled to the metal layer with a plurality of vias, according to one embodiment.

FIG. 1D is an illustration of a cross-sectional view of a substrate 150 having a plurality of EPI layer stacks 108a-b disposed over a plurality of ILD layers 160-161 and a first metal layer 130, according to an optional embodiment. That is, in alternate embodiments, the substrate 150 is similar to the substrate 100 of FIGS. 1A-1C and 1E, but the substrate 150 includes additional layers (e.g., the second EPI layer stack 108b) that may be used to form other desired transistor architectures, such as NW/NR transistors rather than a FinFET architecture (e.g., as shown in FIG. 1E).

In one embodiment, the substrate 150 illustrates disposing a second EPI layer stack 108b on a top surface 109 of a first EPI layer stack 108a, where the first and second EPI layer stacks 108a-b are disposed over the vias 110, the ILD layers 160-161, the first metal layer 130, the etch stop layer 140, and the wafer 102. Note that the substrate 100 may include a predefined number of EPI layer stacks based on the desired processing/packaging design (e.g., a FinFET architecture, a NW/NR architecture, etc.). Also note that the layers 112 and 114 of the first and second EPI layer stacks 108a-b are similar to the first, second, and third layers 112 and 114 of the first EPI layer stack 108 of FIG. 1C—but to simplify describing FIG. 1D the numbering of the layers may be omitted.

In some embodiments, the first EPI layer stack 108a may be disposed on the top surface 161a of the second ILD layer 161 and the top surfaces 110a of the vias 110 that are coupled to the first metal layer 130. In one embodiment, the first EPI layer stack 108a may include a layer 114 disposed directly on the top surface 161a of the second ILD layer 161 and the top surfaces 110a of the vias 110. The first EPI layer stack 108a may include the layer 114 as the base layer (or the initial layer) and then respectively stacked with the layer 112, the layer 114, and the layer 112 as the outer top layer. In an additional embodiment, the second EPI layer stack 108b may include a layer 114 disposed directly on the top surface 109 of the first EPI layer stack 108a. Similarly, the second EPI layer stack 108b may include the layer 114 as the base layer (or the initial layer) and then respectively stacked with the layer 112, the layer 114, and the layer 112 as the outer top layer.

As described above, the layers 112 may be formed of Si while the second layer 114 may be formed of SiGe. For one embodiment, the layers 114 of the first and second EPI layer stacks 108a-b may be used as sacrificial layers to subsequently form one or more transistors (e.g., as shown below in FIG. 1E). In alternate embodiments, the first and second EPI layer stacks 108a-b may include any number of layers (i.e., greater or less than three layers) based on the desired processing/packaging design (e.g., a FinFET architecture, a NW/NR architecture, etc.).

Additionally, for some embodiments, the first and second EPI layer stacks 108a-b may be implemented such that each of the layers 112 and 114 is formed of different materials. In other embodiments, the first and second EPI layer stacks 108a-b may be formed of any suitable CMOS materials that may be used to form one or more CMOS devices (e.g., transistors, memory, etc.). For one embodiment, the layers 112 may have a thickness that is greater than a thickness of the layers 114. In another embodiment, the layers 112 may have a thickness that is approximately equal to a thickness of the layers 114.

Note that the substrate 150 as shown in FIG. 1D may include fewer or additional packaging components and/or materials based on the desired packaging design.

FIG. 1E is an illustration of a cross-sectional a substrate 100 having a plurality of stacked transistors 170 disposed over a plurality of ILD layers 160-161 and a first metal layer 130, where the stacked transistors 170 are coupled to the first metal layer 130 with a plurality of vias 110, according to one embodiment. As described above, the stacked transistors 170 may include, but are not limited to, FinFET transistors, NW/NR transistors, any other type of CMOS transistors, and/or the like. Note that, as illustrated by FIG. 1C (or FIG. 1D) and FIG. 1E, well-known features and process may be omitted or simplified in order not to obscure the illustrative implementations, such as the upfront coupling of the first metal layer 130 to the stacked transistors 170 with the vias 110. As such, it is to be appreciated that the some features (e.g., additional ILD layers, conductive layer, etch stop layers, etc.) are omitted for simplicity.

In some embodiments, the substrate 100 is a CMOS device, such as a transistor device. For one embodiment, the substrate 100 includes a first dielectric layer 160 disposed over a top surface 102a of a wafer 102 (or a substrate). The substrate 100 also includes a plurality of vias 110 disposed on a top surface 130a of a first metal layer 130, where the first metal layer 130 has a bottom surface 130b that is disposed on a top surface 140a of an etch stop layer 140, and where the etch stop layer 140 has a bottom surface 140b that is disposed on the first dielectric layer 160. Furthermore, the substrate 100 includes a second dielectric layer 161 disposed over the first metal layer 130, the vias 110, and the etch stop layer 140, where the vias 110 further include sidewalls 110c, top surfaces 110a, and bottom surfaces 110b that are opposite to the top surfaces 110a. Moreover, the substrate 100 also includes a plurality of stacked transistors 170 disposed on a top surface 161a of the second dielectric layer 161 and the top surfaces 110a of the vias 110, where the sidewalls 110c and the top surfaces 110a of the vias 110 are positioned within a footprint of the stacked layers 170.

For some embodiments, the stacked transistors 170 may include a plurality of gate electrodes 185, a first transistor layer 165, and a second transistor layer 175. In one embodiment, the first and second transistor layers 165 and 175 of the stacked transistors 170 may be an N-type FinFET and a P-type FinFET, or may be a P-type FinFET and an N-type FinFET, respectively. For example, in one embodiment, the first transistor layer 165 may be a PMOS transistor, and the second transistor layer 175 may be a NMOS transistor, where the first and second transistor layers 165 and 175 include the gate electrodes 185.

As described above, the footprint of the stacked transistors 170 may be defined by a bottommost surface 170a of the stacked transistors 170. In some embodiments, as illustrated by portions 180, the bottommost surface 170a of the stacked transistors 170 may be defined (or include) by a bottom surface 165a of the first transistor layer 165 and a bottom surface 185a of the gate electrodes 185. Additionally, the sidewalls 110c and the top surfaces 110a of the vias 110 are vertically aligned with one or more portions of the bottom surface 170a of the stacked transistor 170, where the portions may include the bottom surface 165a of the first transistor layer 165 and/or the bottom surface 185a of the gate electrodes 185. Note that, as shown in FIG. 1E, the substrate 100 has no portion of any of the sidewalls/edges 110c and the top surfaces 110a of the vias 110 positioned/located outside the footprint of the bottommost layer 170a of the stacked transistors 170.

Note that the substrate 100 as shown in FIG. 1E may include fewer or additional packaging components and/or materials based on the desired packaging design.

Figure 2B:
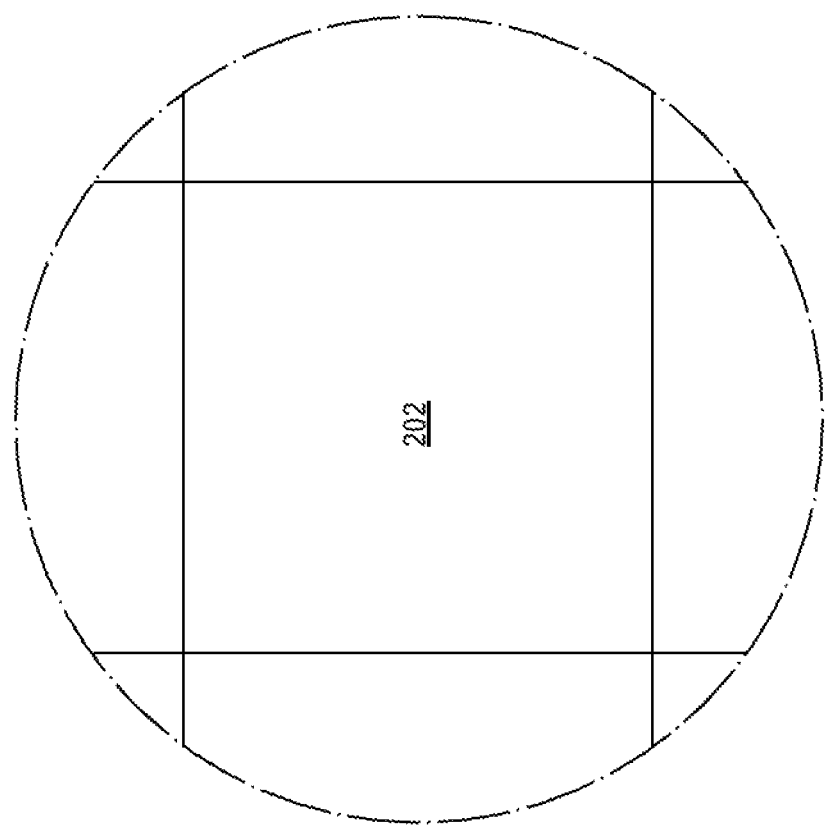
FIGS. 2A and 2B are illustrations of top views of an electronic device having a wafer and dies that include one or more substrates having metal layers coupled upfront to vertically stacked transistors, according to some embodiments.
Figure 2A:
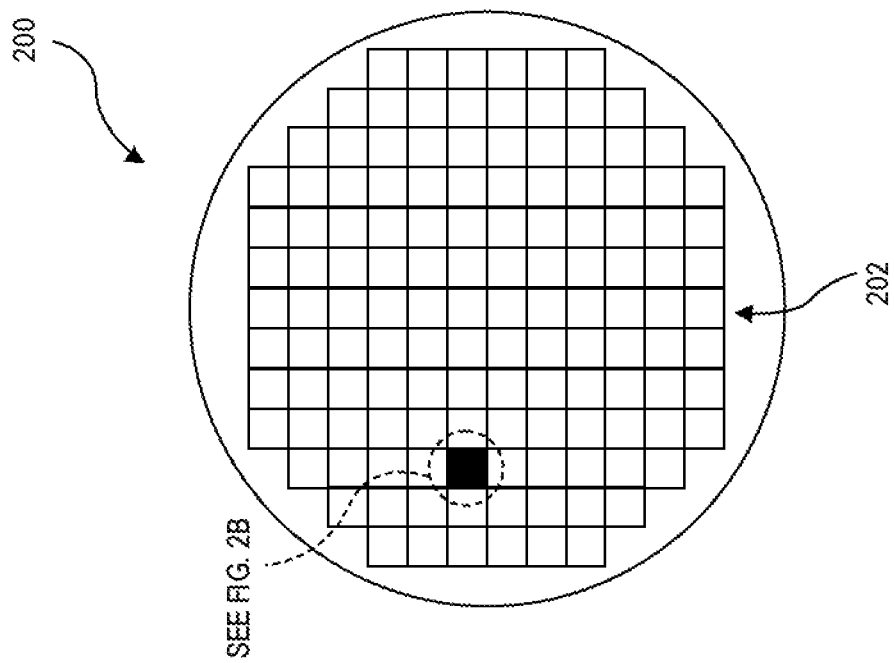

Referring now to FIGS. 2A-2B. The integrated circuit structures described herein may be included in an electronic device. As an example of one such apparatus, FIGS. 2A and 2B are top views of a wafer and dies that include one or more self-aligned substrates having metal layers coupled upfront to vertically stacked transistors, in accordance with one or more of the embodiments described herein.

As illustrated in FIGS. 2A-2B, a wafer 200 may be composed of semiconductor material and may include one or more dies 202 having IC structures formed on a surface of the wafer 200. Each of the dies 202 may be a repeating unit of a semiconductor product that includes any suitable IC (e.g., ICs with one or more self-aligned substrates that have metal layers (in particular M0) coupled upfront to vertically stacked transistors as described above). After the fabrication of the semiconductor product is complete, the wafer 200 may undergo a singulation process in which each of the dies 202 is separated from one another to provide discrete "chips" of the semiconductor product. In particular, structures that include embedded non-volatile memory structures having an independently scaled selector as described herein may take the form of the wafer 200 (e.g., not singulated) or the form of the die 202 (e.g., singulated). The die 202 may include one or more embedded non-volatile memory structures based independently scaled selectors and/or supporting circuitry to route electrical signals, as well as any other IC components. In some embodiments, the wafer 200 or the die 202 may include an additional memory device (e.g., SRAM device), a logic device (e.g., an AND, OR, NAND, or NOR gate), or any other suitable circuit element. Multiple ones of these devices may be combined on a single die 202. For example, a memory array formed by multiple memory devices may be formed on a same die 202 as a processing device or other logic that is configured to store information in the memory devices or execute instructions stored in the memory array.

Embodiments described herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches described herein.

Note that the wafer 200 and/or the die 202 of FIGS. 2A-2B may include fewer or additional components and/or materials based on the desired packaging design.

Figure 3:
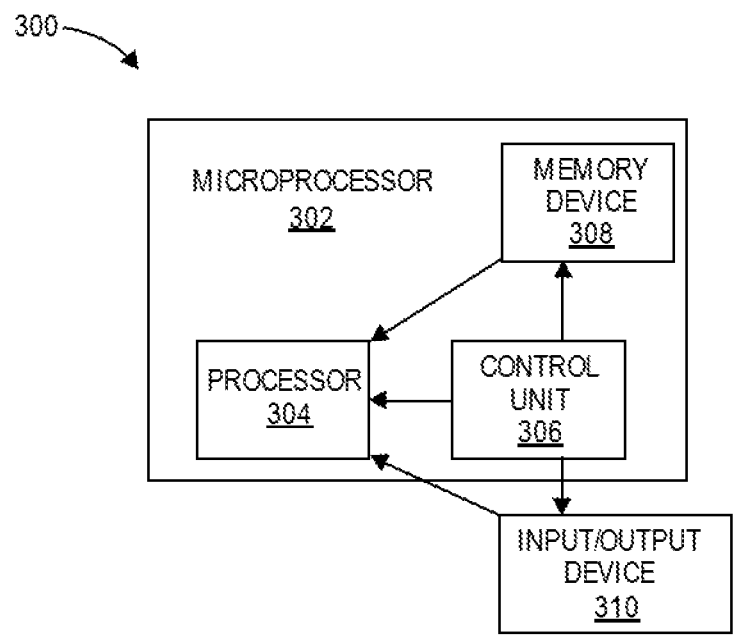
FIG. 3 is a schematic block diagram illustrating an electronic system that utilizes an input/output (I/O) device and a semiconductor package, which includes a processor, a memory device, and a control unit, according to one embodiment.

FIG. 3 is a schematic block diagram illustrating an electronic system 300 that utilizes an input/output (I/O) device 310 and a microprocessor 302, which includes a processor 304, a memory device 308, and a control unit 306, according to one embodiment. FIG. 3 is an illustration of an electronic system 300, according to one embodiment. The electronic system 300 can correspond to, for example, a portable system, a computer system, a process control system, or any other system that utilizes a processor and an associated memory. The electronic system 300 may include the microprocessor 302, the processor 304, the control unit 306, the memory device 308, and the I/O device 310. Note that it is to be appreciated that the electronic system 300 may have a plurality of processors, control units, memory device units, and/or I/O devices in various embodiments. In one embodiment, the electronic system 300 has a set of instructions that define operations which are to be performed on data by the processor 304, as well as, other transactions between the processor 304, the memory device 308, and the I/O device 310. The control unit 306 coordinates the operations of the processor 304, the memory device 308 and the I/O device 310 by cycling through a set of operations that cause instructions to be retrieved from the memory device 308 and executed. The memory device 308 can include a substrate (or a transistor device) as described above (e.g., the substrate 100 of FIGS. 1A-1E). In an embodiment, the memory device 308 is embedded in the microprocessor 302, as illustrated in FIG. 3. In another embodiment, the processor 304, or another component of the electronic system 300, may include one or more self-aligned substrates having metal layers (in particular the M0 layer) coupled upfront to vertically stacked transistors, such as those described herein.

Note that the electronic system 300 of FIG. 3 may include fewer or additional packaging components and/or materials based on the desired packaging design.

Figure 4:
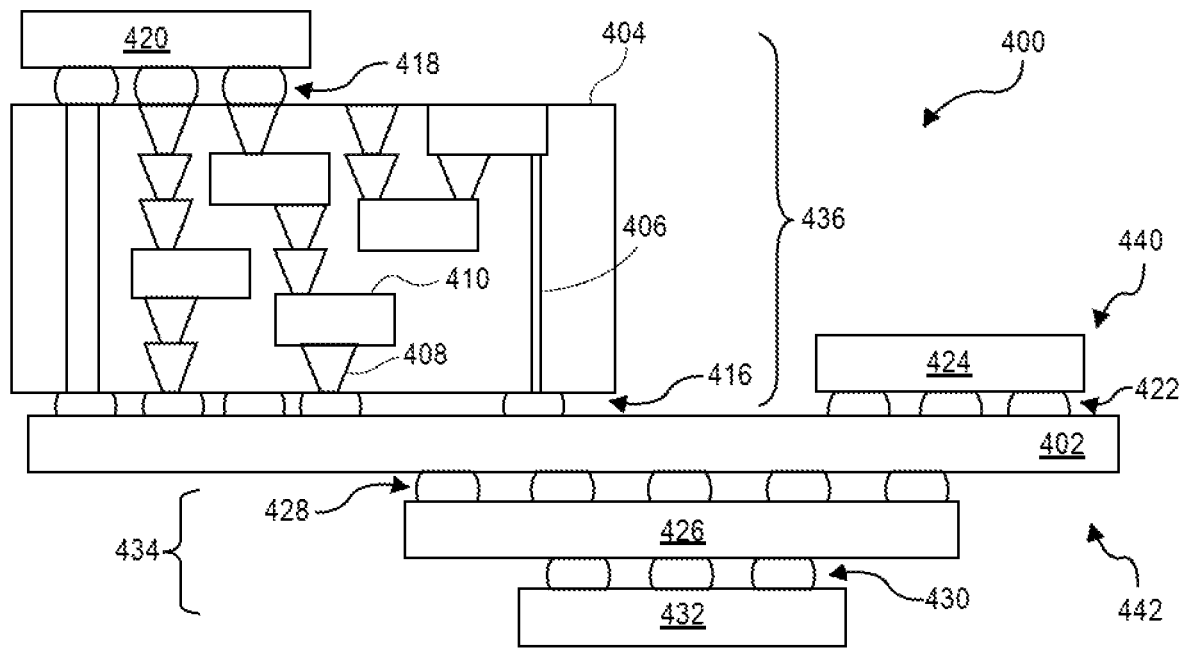
FIG. 4 is a cross-sectional view of an integrated circuit (IC) device assembly that includes one or more substrates having metal layers coupled upfront to vertically stacked transistors, according to one embodiment.

FIG. 4 is a cross-sectional side view of an IC device assembly which may include one or more self-aligned substrates having metal layers coupled upfront to vertically stacked transistors, in accordance with one or more of the embodiments described herein. As illustrated in FIG. 4, an IC device assembly 400 includes components having one or more IC structures as described herein. The IC device assembly 400 includes a number of components disposed on a circuit board 402 (e.g., a motherboard). The IC device assembly 400 includes components disposed on a first face 440 of the circuit board 402 and an opposing second face 442 of the circuit board 402. Generally, components may be disposed on one or both faces 440 and 442. In particular, any suitable ones of the components of the IC device assembly 400 may include a number of CMOS structures, such as CMOS transistors, that have one or more self-aligned substrates with metal layers coupled upfront to vertically stacked transistors, such as the transistor devices described herein.

In some embodiments, the circuit board 402 may be a PCB including multiple metal layers separated from one another by layers of dielectric material (e.g., the first metal layer 130 separated by the first and second ILD layers 160-161 of FIGS. 1A-1E as described above) and interconnected by electrically conductive vias (e.g., the vias 110 of FIGS. 1A-1E as described above). Any one or more of the metal layers may be formed in a desired circuit pattern to route electrical signals (optionally in conjunction with other metal layers) between the components coupled to the circuit board 402. In other embodiments, the circuit board 402 may be a non-PCB substrate.

The IC device assembly 400 illustrated in FIG. 4 includes a package-on-interposer structure 436 coupled to the first face 440 of the circuit board 402 by coupling components 416. The coupling components 416 may electrically and mechanically couple the package-on-interposer structure 436 to the circuit board 402, and may include solder balls (as shown in FIG. 4), male and female portions of a socket, an adhesive, an underfill material, and/or any other suitable electrical and/or mechanical coupling structure.

The package-on-interposer structure 436 may include an IC package 420 coupled to an interposer 404 by coupling components 418. The coupling components 418 may take any suitable form for the application, such as the forms discussed above with reference to the coupling components 416. Although a single IC package 420 is shown in FIG. 4, multiple IC packages may be coupled to the interposer 404. Note that it is to be appreciated that additional interposers may be coupled to the interposer 404. The interposer 404 may provide an intervening substrate used to bridge the circuit board 402 and the IC package 420. The IC package 420 may be or include, for example, a die (e.g., the die 202 of FIG. 2B), or any other suitable component. Generally, the interposer 404 may spread a connection to a wider pitch or reroute a connection to a different connection. For example, the interposer 404 may couple the IC package 420 (e.g., a die) to a ball grid array (BGA) of the coupling components 416 for coupling to the circuit board 402. In the embodiments illustrated in FIG. 4, the IC package 420 and the circuit board 402 are attached to opposing sides of the interposer 404. In other embodiments, the IC package 420 and the circuit board 402 may be attached to a same side of the interposer 404. In some embodiments, three or more components may be interconnected by way of the interposer 404.

The interposer 404 may be formed of an epoxy resin, a fiberglass-reinforced epoxy resin, a ceramic material, or a polymer material such as polyimide. In some implementations, the interposer 404 may be formed of alternate rigid or flexible materials that may include the same materials described above for use in a semiconductor substrate, such as silicon, germanium, and other group III-V and group IV materials. The interposer 404 may include metal interconnects 410 and vias 408, including but not limited to through-silicon vias (TSVs) 406. The interposer 404 may further include embedded devices 414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 404. The package-on-interposer structure 436 may take the form of any of the package-on-interposer structures known in the art.

The IC device assembly 400 may include an IC package 424 coupled to the first face 440 of the circuit board 402 by coupling components 422. The coupling components 422 may take the form of any of the embodiments discussed above with reference to the coupling components 416, and the IC package 424 may take the form of any of the embodiments described above with reference to the IC package 420.

The IC device assembly 400 illustrated in FIG. 4 includes a package-on-package structure 434 coupled to the second face 442 of the circuit board 402 by coupling components 428. The package-on-package structure 434 may include an IC package 426 and an IC package 432 coupled together by coupling components 430 such that the IC package 426 is disposed between the circuit board 402 and the IC package 432. The coupling components 428 and 430 may take the form of any of the embodiments of the coupling components 416 discussed above, and the IC packages 426 and 432 may take the form of any of the embodiments of the IC package 420 described above. The package-on-package structure 434 may be configured in accordance with any of the package-on-package structures known in the art.

Note that the IC device assembly 400 of FIG. 4 may include fewer or additional packaging components and/or materials based on the desired packaging design.

Figure 5:
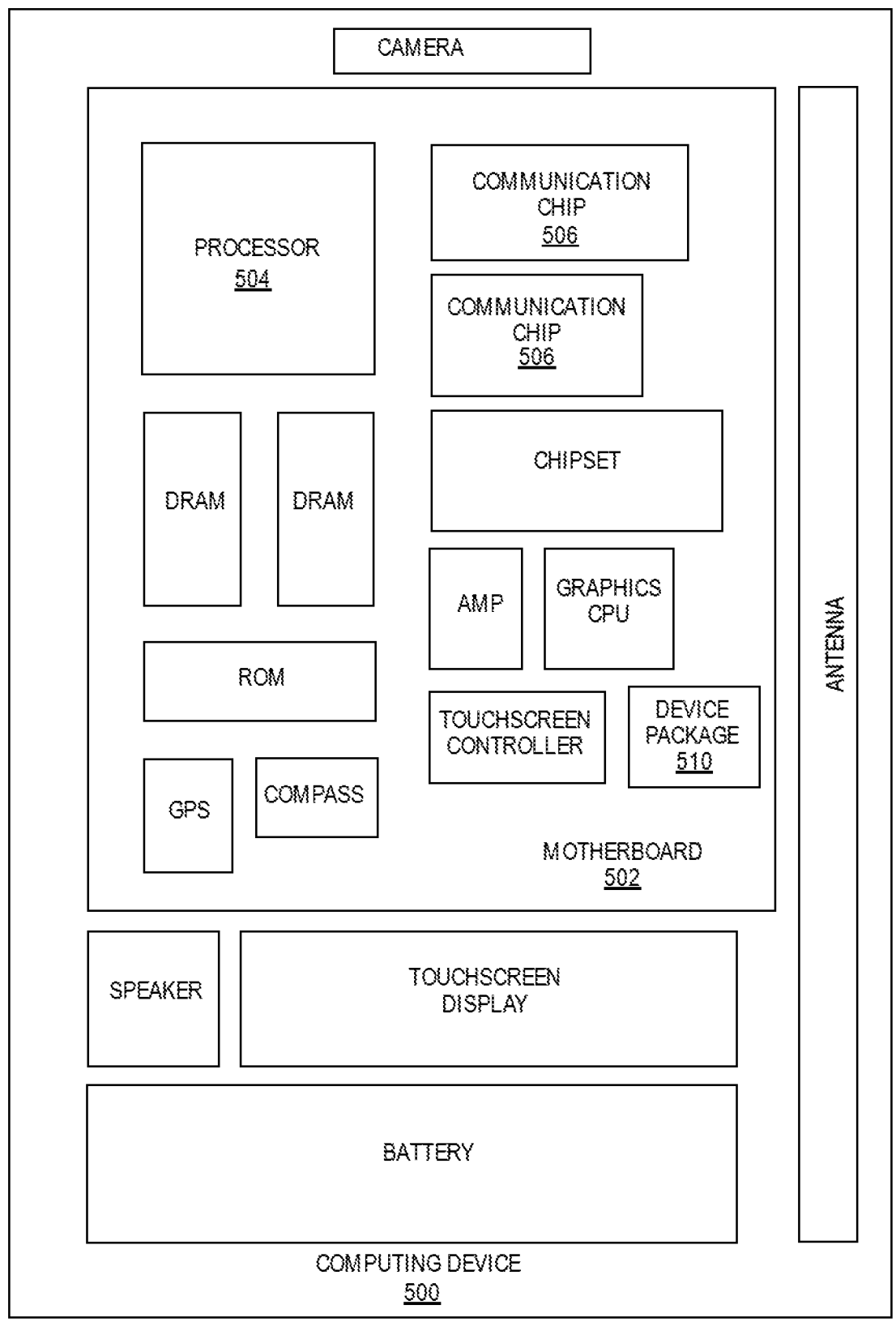
FIG. 5 is a schematic block diagram illustrating a computer system that utilizes a device package having one or more substrates having metal layers coupled upfront to vertically stacked transistors, according to one embodiment.

FIG. 5 is a schematic block diagram illustrating a computer system 500 that utilizes a device package 510 having a self-aligned substrate having ILD layers and metal layers coupled upfront to a plurality of stacked transistors, according to one embodiment. FIG. 5 illustrates an example of computing device 500. Computing device 500 houses motherboard 502. For one embodiment, motherboard 502 may be similar to the circuit board 402 of FIG. 4. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a packaging/package substrate, and/or a PCB. Device package 510 may include one or more substrates, such as the transistor devices, having the ILD layers and at least a first metal layer (M0) coupled upfront to a plurality of stacked transistors—without via edge errors, wafer bonding, flipping, multi-color patterning, and/or complex interconnect schemes—as described herein (e.g., as illustrated in FIGS. 1A-1E). Device package 510 may also include any other components from the Figures described herein.

Note that device package 510 may be a single component/device, a subset of components, and/or an entire system, as the materials, features, and components may be limited to device package 510 and/or any other component of the computing device 500 that may need transistor devices which include ILD layers and at least a first metal layer (M0) coupled upfront to a plurality of stacked transistors (e.g., the motherboard 502, the processor 504, and/or any other component of the computing device 500).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1

A transistor device, comprising: a first dielectric layer over a substrate; a plurality of vias on a first metal layer, wherein the first metal layer is on an etch stop layer that is on the first dielectric layer; a second dielectric layer over the first metal layer, the plurality of vias, and the etch stop layer, wherein the plurality of vias include sidewalls, top surfaces, and bottom surfaces that are opposite to the top surfaces; and a plurality of stacked transistors on the second dielectric layer and the top surfaces of the plurality of vias, wherein the sidewalls and the top surfaces of the plurality of vias are positioned within a footprint of the plurality of stacked layers.

Example 2

The transistor device of Example 1, wherein the plurality of stacked transistors include a plurality of gate electrodes, a first transistor layer, and a second transistor layer.

Example 3

The transistor device of Examples 1-2, wherein the footprint of the plurality of stacked transistors is defined by a bottom surface of the first transistor layer and a bottom surface of the gate electrodes.

Example 4

The transistor device of claim Examples 1-3, wherein the sidewall and the top surfaces of the plurality of vias are vertically aligned with one or more portions of the bottom surfaces of the first transistor layer or the gate electrodes.

Example 5

The transistor device of Examples 1-4, wherein the first metal layer includes one or more conductive materials, and wherein the one or more conductive materials include tungsten (W) or cobalt (Co).

Example 6

The transistor device of Examples 1-5, wherein the sidewalls of the plurality of vias are vertical sidewalls or tapered sidewalls.

Example 7

The transistor device of Examples 1-6, further comprising a plurality of metal layers disposed over the first metal layer.

Example 8

The transistor device of Examples 1-7, wherein the plurality of stacked transistors include fin field effect transistors (FinFET) transistors, nanowire (NW) transistors, or nanoribbon (NR) transistors.

Example 9

The transistor device of Examples 1-8, further comprising a plurality of etch stop layers disposed over the first metal layer and the etch stop layer, wherein the etch stop layer and the plurality of etch stop layers are formed of the same material.

Example 10

A method of forming a transistor device, comprising: disposing a first dielectric layer over a substrate; disposing a plurality of vias on a first metal layer, wherein the first metal layer is disposed on an etch stop layer that is on the first dielectric layer; disposing a second dielectric layer over the first metal layer, the plurality of vias, and the etch stop layer, wherein the plurality of vias include sidewalls, top surfaces, and bottom surfaces that are opposite to the top surfaces; and disposing a plurality of stacked transistors on the second dielectric layer and the top surfaces of the plurality of vias, wherein the sidewalls and the top surfaces of the plurality of vias are positioned within a footprint of the plurality of stacked layers.

Example 11

The method of Example 10, wherein the plurality of stacked transistors include a plurality of gate electrodes, a first transistor layer, and a second transistor layer.

Example 12

The method of Examples 10-11, wherein the footprint of the plurality of stacked transistors is defined by a bottom surface of the first transistor layer and a bottom surface of the gate electrodes.

Example 13

The method of Examples 10-12, wherein the sidewall and the top surfaces of the plurality of vias are vertically aligned with one or more portions of the bottom surfaces of the first transistor layer or the gate electrodes.

Example 14

The method of Examples 10-13, wherein the first metal layer includes one or more conductive materials, wherein the plurality of stacked transistors include FinFET transistors, NW transistors, or NR transistors, and wherein the one or more conductive materials include W or Co.

Example 15

The method of Examples 10-14, wherein the sidewalls of the plurality of vias are vertical sidewalls or tapered sidewalls.

Example 16

The method of Examples 10-15, further comprising disposing a plurality of metal layers over the first metal layer.

Example 17

The method of Examples 10-16, wherein disposing the plurality of stacked transistors further comprises: disposing a plurality of epitaxial (EPI) layer stacks on the second dielectric layer and the top surfaces of the plurality of vias; and patterning the plurality of EPI layer stacks to form the plurality of stacked transistors on the second dielectric layer and the top surfaces of the plurality of vias.

Example 18

The method of Examples 10-17, further comprising disposing a plurality of etch stop layers over the first metal layer and the etch stop layer, wherein the etch stop layer and the plurality of etch stop layers are formed of the same material.

Example 19

A memory device, comprising: a semiconductor substrate; a plurality of dielectrics and a plurality of metal layers above the semiconductor substrate; and a transistor device integrated into the plurality of dielectrics and metal layers, wherein the transistor device includes a first dielectric layer of the plurality of dielectrics above the semiconductor substrate; a plurality of vias on a first metal layer of the plurality of metal layers, wherein the first metal layer is on an etch stop layer disposed on the first dielectric layer; a second dielectric layer of the plurality of dielectrics above the first metal layer, the plurality of vias, and the etch stop layer, wherein the plurality of vias include sidewalls, top surfaces, and bottom surfaces that are opposite to the top surfaces; and a plurality of stacked transistors disposed on the second dielectric layer and the top surfaces of the plurality of vias, wherein the sidewalls and the top surfaces of the plurality of vias are positioned within a footprint of the plurality of stacked layers.

Example 20

The memory device of Example 19, wherein the plurality of stacked transistors include a plurality of gate electrodes, a first transistor layer, and a second transistor layer.

Example 21

The memory device of Examples 19-20, wherein the footprint of the plurality of stacked transistors is defined by a bottom surface of the first transistor layer and a bottom surface of the gate electrodes.

Example 22

The memory device of Examples 19-21, wherein the sidewall and the top surfaces of the plurality of vias are vertically aligned with one or more portions of the bottom surfaces of the first transistor layer or the gate electrodes.

Example 23

The memory device of Examples 19-22, wherein the first metal layer includes one or more conductive materials, and wherein the one or more conductive materials include W or Co.

Example 24

The memory device of Examples 19-23, wherein the sidewalls of the plurality of vias are vertical sidewalls or tapered sidewalls, and wherein the plurality of stacked transistors include FinFET transistors, NW transistors, or NR transistors Example 25

The memory device of Examples 19-24, further comprising a plurality of etch stop layers integrated into the plurality of metal layers and the plurality of dielectrics above the semiconductor substrate, wherein the etch stop layer and the plurality of etch stop layers are formed of the same material.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

What is claimed is:

1. A transistor device, comprising:
a first dielectric layer over a substrate;
a plurality of vias on a first metal layer, wherein the first metal layer is on an etch stop layer that is on the first dielectric layer;
a second dielectric layer over the first metal layer, and the etch stop layer, wherein the plurality of vias include sidewalls, top surfaces, and bottom surfaces that are opposite to the top surfaces, and wherein the second dielectric layer is laterally adjacent to the sidewalls of the plurality of vias; and
a plurality of stacked transistors on the second dielectric layer and the top surfaces of the plurality of vias, wherein the sidewalls and the top surfaces of the plurality of vias are positioned within a footprint of the plurality of stacked transistors.

2. The transistor device of claim 1, wherein the plurality of stacked transistors include a plurality of gate electrodes, a first transistor layer, and a second transistor layer.

3. The transistor device of claim 2, wherein the footprint of the plurality of stacked transistors is defined by a bottom surface of the first transistor layer and a bottom surface of the gate electrodes.

4. The transistor device of claim 3, wherein the sidewall and the top surfaces of the plurality of vias are vertically aligned with one or more portions of the bottom surfaces of the first transistor layer or the gate electrodes.

5. The transistor device of claim 1, wherein the first metal layer includes one or more conductive materials, and wherein the one or more conductive materials include tungsten (W) or cobalt (Co).

6. The transistor device of claim 4, wherein the sidewalls of the plurality of vias are vertical sidewalls or tapered sidewalls.

7. The transistor device of claim 1, further comprising a plurality of metal layers disposed over the first metal layer.

8. The transistor device of claim 1, wherein the plurality of stacked transistors include fin field effect transistors (FinFET) transistors, nanowire (NW) transistors, or nanoribbon (NR) transistors.

9. The transistor device of claim 1, further comprising a plurality of etch stop layers disposed over the first metal layer and the etch stop layer, wherein the etch stop layer and the plurality of etch stop layers are formed of the same material.

10. A memory device, comprising:
a semiconductor substrate;
a plurality of dielectrics and a plurality of metal layers above the semiconductor substrate; and
a transistor device integrated into the plurality of dielectrics and metal layers, wherein the transistor device includes
a first dielectric layer of the plurality of dielectrics above the semiconductor substrate;
a plurality of vias on a first metal layer of the plurality of metal layers, wherein the first metal layer is on an etch stop layer disposed on the first dielectric layer;
a second dielectric layer of the plurality of dielectrics above the first metal layer, and the etch stop layer, wherein the plurality of vias include sidewalls, top surfaces, and bottom surfaces that are opposite to the top surfaces, and wherein the second dielectric layer is laterally adjacent to the sidewalls of the plurality of vias; and
a plurality of stacked transistors disposed on the second dielectric layer and the top surfaces of the plurality of vias, wherein the sidewalls and the top surfaces of the plurality of vias are positioned within a footprint of the plurality of stacked transistors.

11. The memory device of claim 10, wherein the plurality of stacked transistors include a plurality of gate electrodes, a first transistor layer, and a second transistor layer.

12. The memory device of claim 11, wherein the footprint of the plurality of stacked transistors is defined by a bottom surface of the first transistor layer and a bottom surface of the gate electrodes.

13. The memory device of claim 12, wherein the sidewall and the top surfaces of the plurality of vias are vertically aligned with one or more portions of the bottom surfaces of the first transistor layer or the gate electrodes.

14. The memory device of claim 10, wherein the first metal layer includes one or more conductive materials, and wherein the one or more conductive materials include W or Co.

15. The memory device of claim 13, wherein the sidewalls of the plurality of vias are vertical sidewalls or tapered sidewalls, and wherein the plurality of stacked transistors include FinFET transistors, NW transistors, or NR transistors.

16. The memory device of claim 10, further comprising a plurality of etch stop layers integrated into the plurality of metal layers and the plurality of dielectrics above the semiconductor substrate, wherein the etch stop layer and the plurality of etch stop layers are formed of the same material.

* * * * *